(12) United States Patent
Yamada

(10) Patent No.: US 6,692,877 B2
(45) Date of Patent: Feb. 17, 2004

(54) MASK FOR BEAM EXPOSURE HAVING MEMBRANE STRUCTURE AND STENCIL STRUCTURE AND METHOD FOR MANUFACTURING THE SAME

(75) Inventor: Yasuhisa Yamada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 100 days.

(21) Appl. No.: 09/982,051

(22) Filed: Oct. 17, 2001

(65) Prior Publication Data

US 2002/0045109 A1 Apr. 18, 2002

(30) Foreign Application Priority Data

Oct. 17, 2000 (JP) ........................................ 2000-317223

(51) Int. Cl.$^7$ .................................................. G03F 9/00
(52) U.S. Cl. .......................................................... 430/5
(58) Field of Search ............................................. 430/5

(56) References Cited

FOREIGN PATENT DOCUMENTS

JP          05-062888          3/1993

*Primary Examiner*—Christopher G. Young
(74) *Attorney, Agent, or Firm*—Choate, Hall & Stewart

(57) ABSTRACT

In a mask for beam exposure, a membrane structure for endless patterns and a stencil structure for terminated patterns are provided in combination.

18 Claims, 20 Drawing Sheets

DATA A

DATA B

DATA C

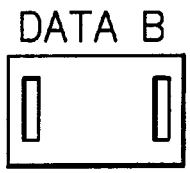

Fig. 10D
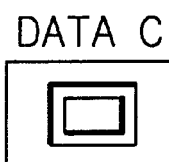

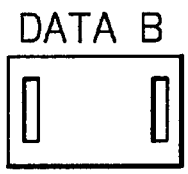

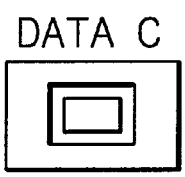

MASK FOR BEAM EXPOSURE HAVING MEMBRANE STRUCTURE AND STENCIL STRUCTURE AND METHOD FOR MANUFACTURING THE SAME

BACKGROUND OF THE INVENTION

1. Field of the Invention

The present invention relates to a mask for beam exposure such as charged particle exposure, particularly, electron beam exposure, and X-ray exposure, and a method for manufacturing the same.

2. Description of the Related Art

Generally, in the manufacture of semiconductor devices, a photolithography technology using ultraviolet rays has been indispensible for forming photoresist patterns. However, as the integration of semiconductor devices has been developed, a lithography technology using charged particle beam exposure, particularly, electron beam exposure and X-ray exposure has been developed, since the wavelength thereof is much smaller than that of ultraviolet rays. For example, in an electron beam lithography technology, a mask for electron beam exposure is used to form electron-beam resist patterns.

Prior art masks for electron beam exposure are of a stencil type. However, the stencil type masks hardly provide endless patterns. This will be explained later in detail.

Other prior art masks for electron beam exposure is of a membrane type. However, when terminated patterns are formed in the membrane type masks, openings for the terminated patterns cannot be completely perforated in the masks, so that the contrast of electron beams is deteriorated. Also, since the electron beams are scattered by the membrane structure, the blurring of the electron beams is increased. Thus, a higher resolution cannot be realized for the terminated patterns. This will be explained later in detail.

SUMMARY OF THE INVENTION

It is an object of the present invention to provide a mask for beam exposure such as electron beam exposure capable of realizing high resolution terminated patterns as well as surely realizing endless patterns.

Another object is to provide a method for manufacturing such a mask.

According to the present invention, in a mask for beam exposure, a membrane structure for endless patterns and a stencil structure for terminated patterns are provided in combination.

BRIEF DESCRIPTION OF THE DRAWINGS

The present invention will be more clearly understood from the description set forth below, as compared with the prior art, with reference to the accompanying drawings, wherein:

FIGS. 10A, 10B, 10C, 10D, 10E, 10F, 10G, 11A, 11B, 11C, 11D, 11E, 11F, 11G, 12A, 12B, 12C and 12D are cross-sectional views for explaining a method for manufacturing the mask of FIGS. 7, 8A and 8B;

DESCRIPTION OF THE PREFERRED EMBODIMENTS

Before the description of the preferred embodiments, prior art masks for electron beam exposure will be explained with reference to FIGS. 1A, 1B, 2A, 2B, 3A, 3B, 4, 5 and 6.

Figure 1A:
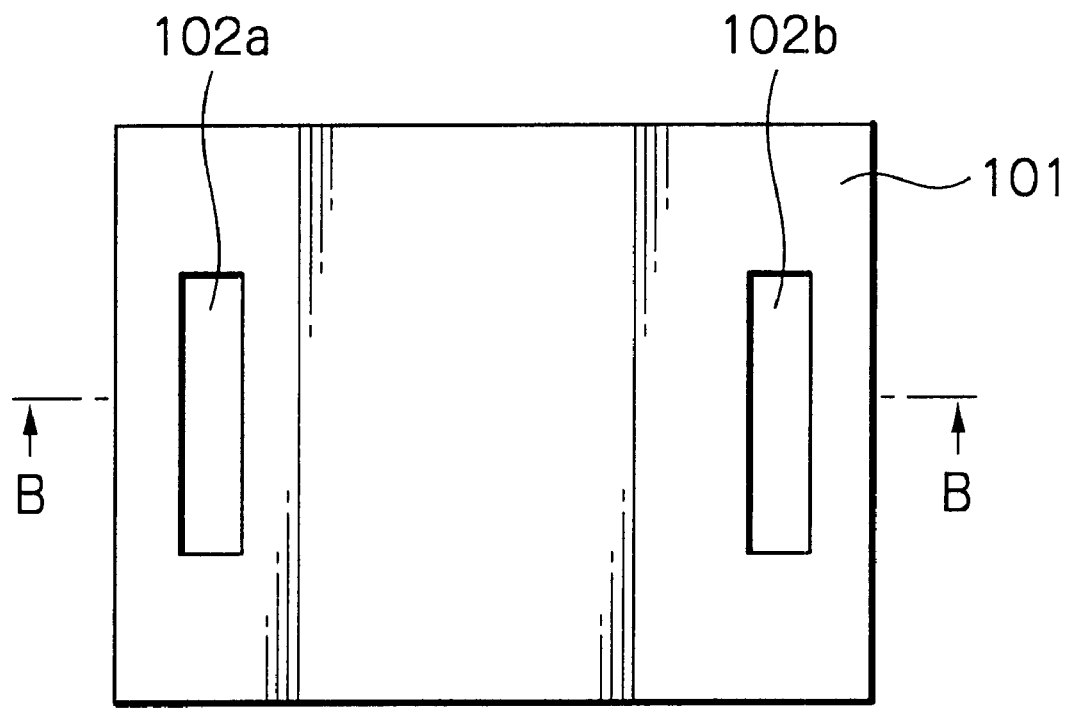
FIG. 1A is a plan view illustrating a first prior art mask.
Figure 1B:
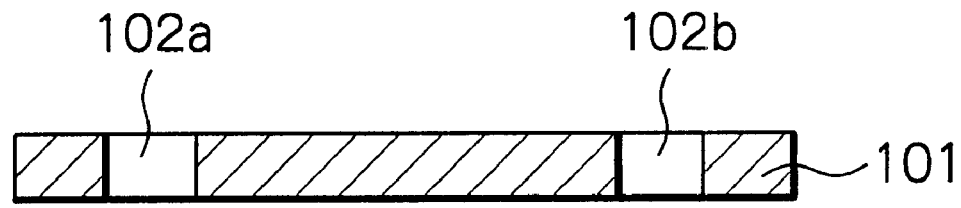
FIG. 1B is a cross-sectional view taken along the line B—B of FIG. 1A.

FIG. 1A is a plan view illustrating a first prior art mask and FIG. 1B is a cross-sectional view taken along the line B—B of FIG. 1A. In FIGS. 1A and 1B, the mask is of a stencil type which is constructed by a silicon substrate where openings 102a and 102b each having a terminated pattern are perforated. There is no problem in the mask of FIGS. 1A and 1B.

Figure 2A:
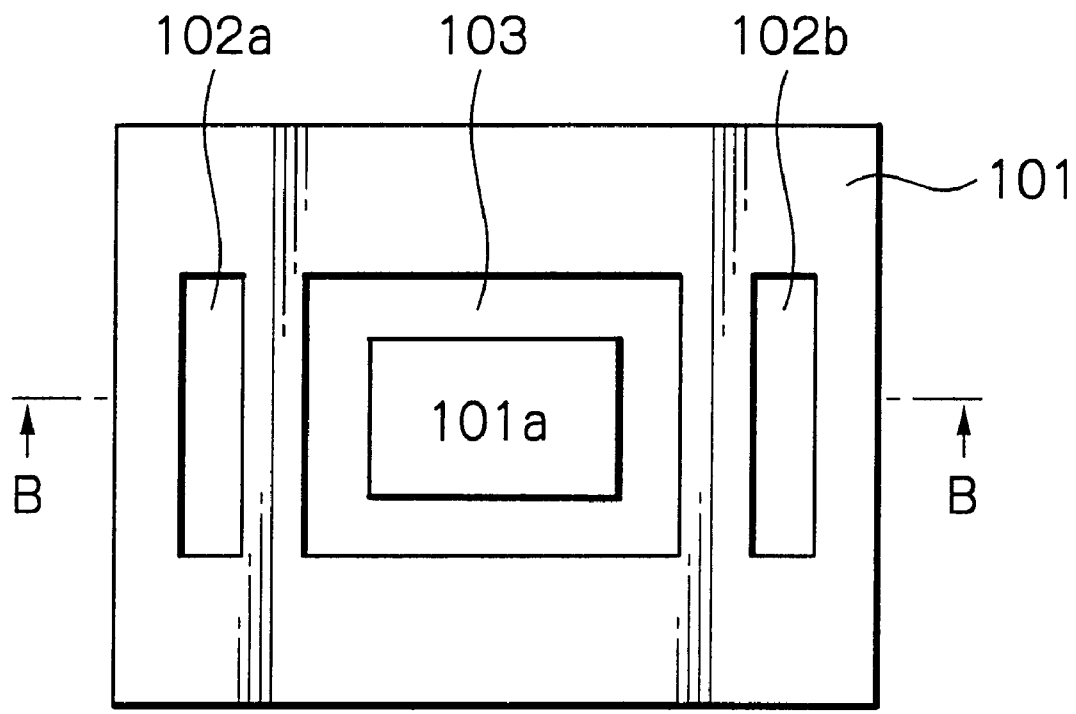
FIG. 2A is a plan view illustrating a second prior art mask.
Figure 2B:
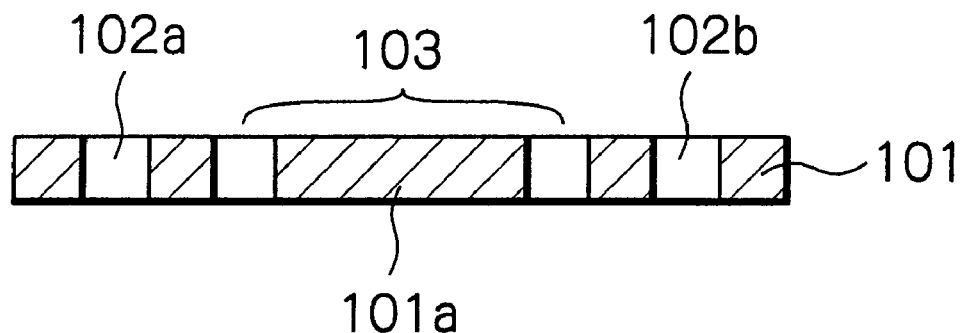
FIG. 2B is a cross-sectional view taken along the line B—B of FIG. 2A.
Figure 3A:
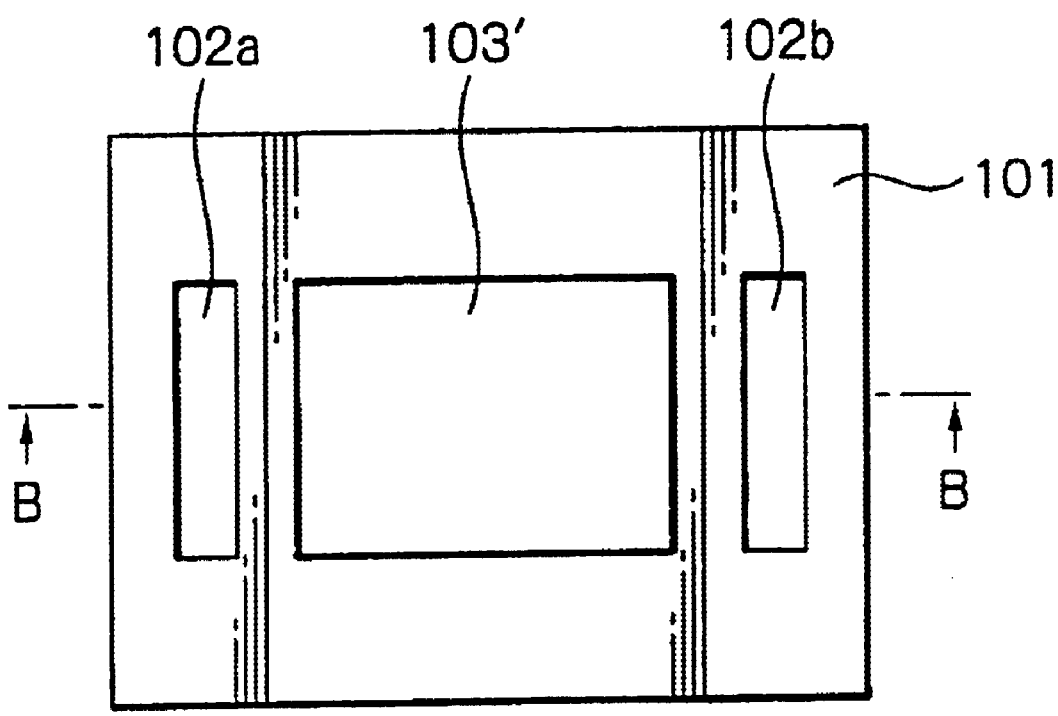
FIGS. 3A and 3B are a plan view and a cross-sectional view, respectively, for explaining a problem caused in the mask of FIGS. 2A and 2B.
Figure 3B:
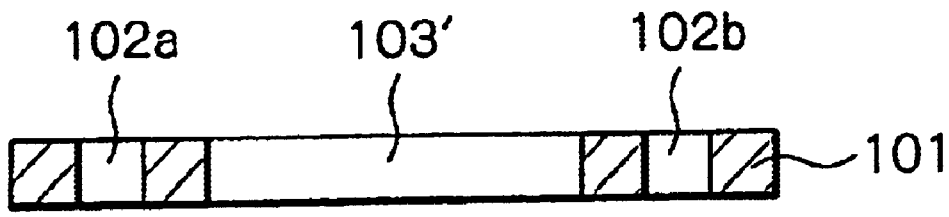

FIG. 2A is a plan view illustrating a second prior art mask and FIG. 2B is a cross-sectional view taken along the line B—B of FIG. 2A. In FIGS. 2A and 2B, an additional opening 103 having an endless pattern is perforated in the silicon substrate 101 of FIGS. 1A and 1B. In this case, however, since an island 101a of the silicon substrate 101 is not supported by the rest thereof, the island 101a is separated from the silicon substrate 101. As a result, the mask of FIGS. 2A and 2B is actually a mask as illustrated in FIGS. 3A and 3B where an rectangular opening 103' is perforated.

Thus, in the stencil type mask of FIGS. 2A and 2B, it is impossible to form an endless pattern, which is a problem.

Figure 4:
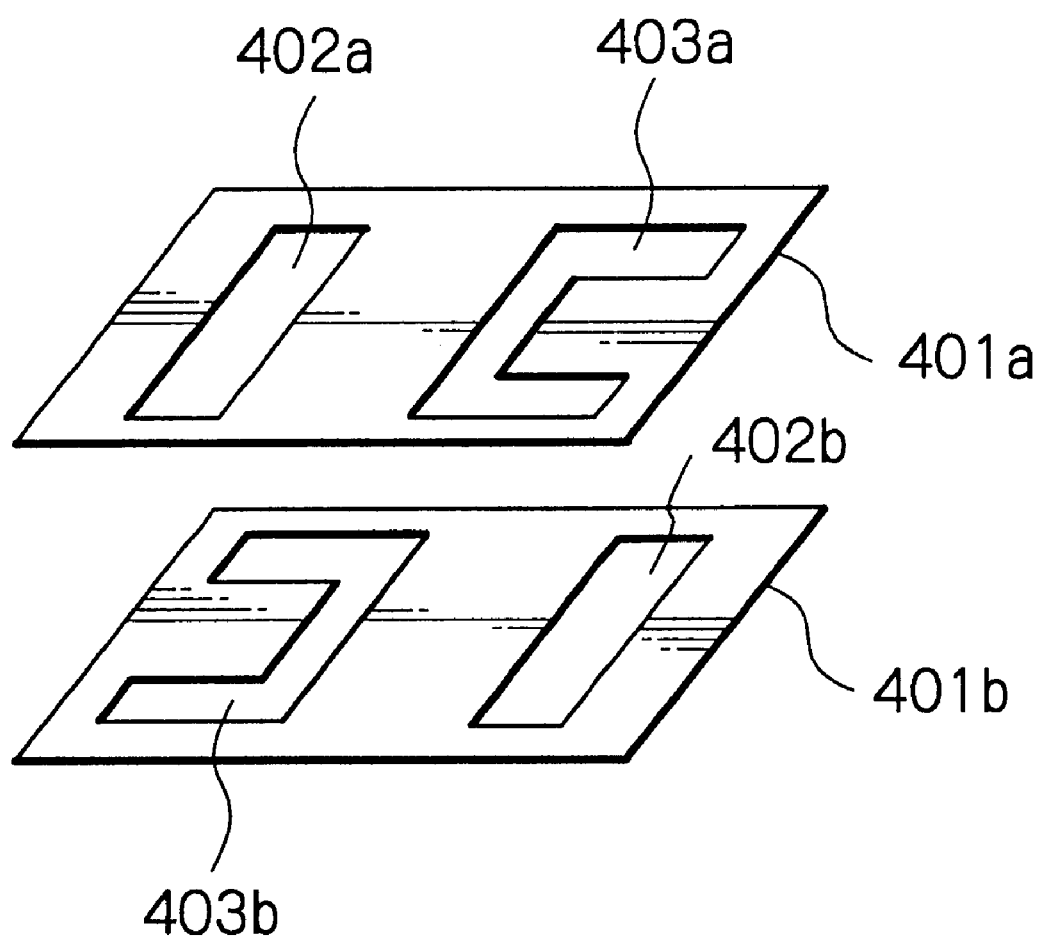
FIG. 4 is a perspective view illustrating a third prior art mask.

In FIG. 4, which is a perspective view illustrating a third prior art mask, two complementary masks 401a and 401b of a stencil type are provided. The masks 401a and 401b have openings 402a and 402b, respectively, for terminated patterns, and openings 403a and 403b for a terminated pattern. That is, the openings 403a and 403b in combination correspond to the opening 103 of FIGS. 2A and 2B form an endless pattern.

Figure 5:
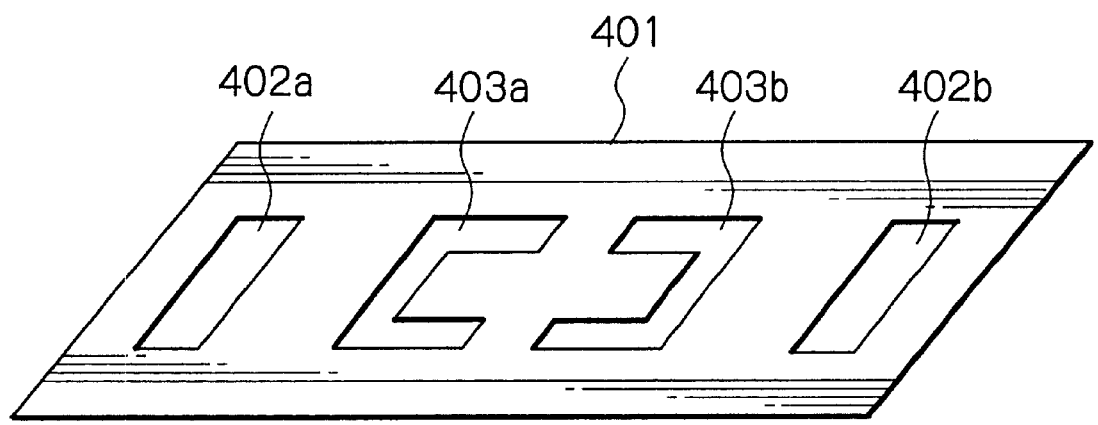
FIG. 5 is a perspective view illustrating a fourth prior art mask.

In FIG. 5, which is a perspective view illustrating a fourth prior art mask, one complementary mask 401 of a stencil type is provided. The mask 401 has openings 402a and 402b for terminated patterns and openings 403a and 403b for a terminated pattern. Even in FIG. 5, in the same way as in FIG. 4, the openings 403a and 403b in combination correspond to the opening 103 of FIGS. 2A and 2B.

In FIGS. 4 and 5, the problem caused by the mask of FIGS. 2A and 2B is solved. In FIGS. 4 and 5, however, since two patterns have to be formed for each endless pattern, the control for depicting the two patterns is complex. Also, since the deflection of electron beams is required, the butting accuracy of electron beam exposure between the two patterns is low. After all, the manufacturing cost of semiconductor devices is increased while the reliability thereof is deteriorated.

Figure 6A:
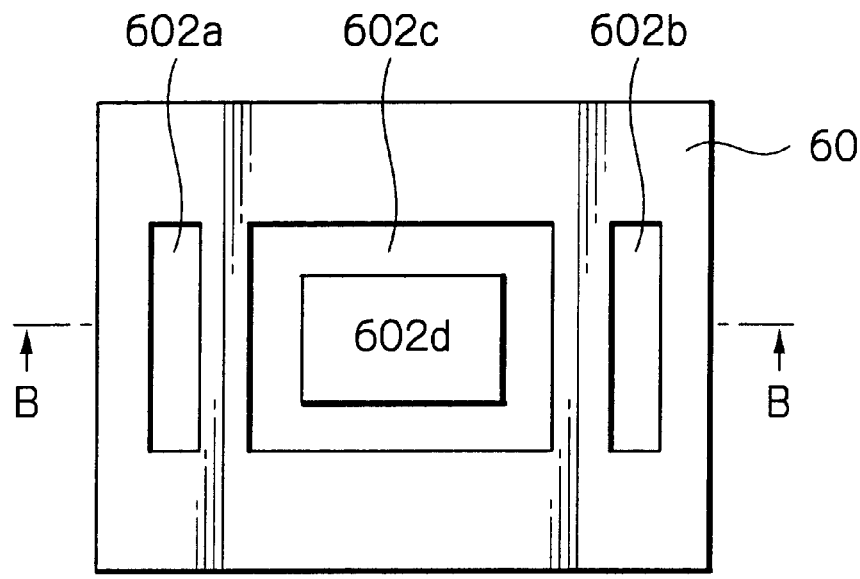
FIG. 6A is a plan view illustrating a fifth prior art mask.
Figure 6B:
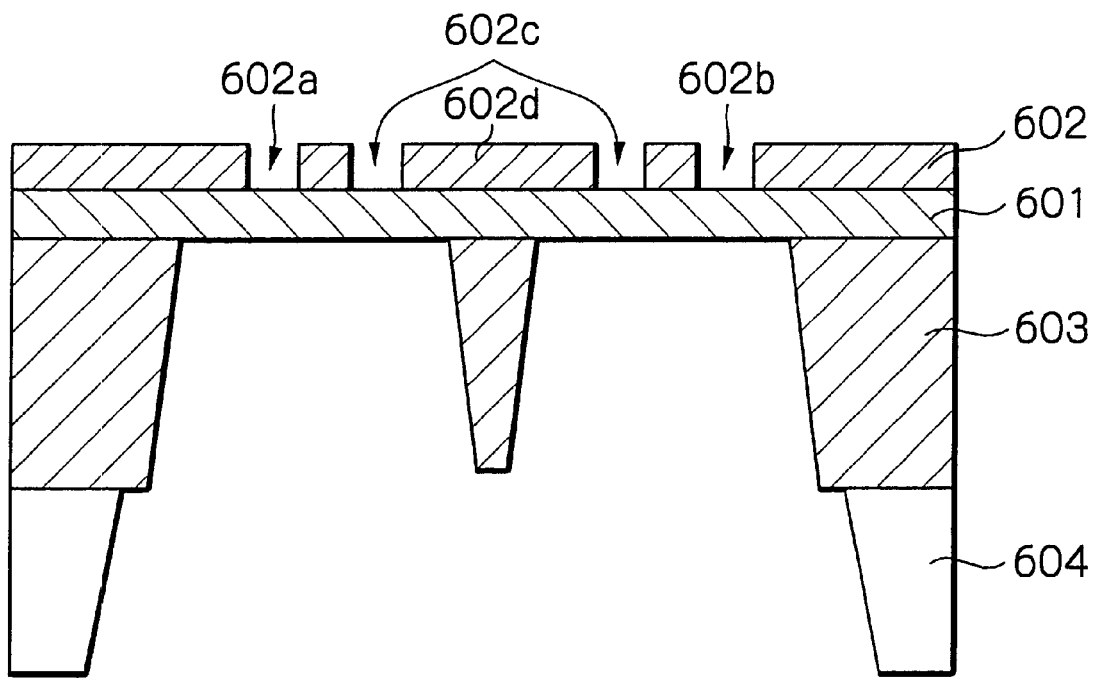
FIG. 6B is a cross-sectional view taken along the line B—B of FIG. 6A.

FIG. 6A is a plan view illustrating a fifth prior art mask and FIG. 6B is a cross-sectional view taken along the line B—B of FIG. 6A (see: JP-A-5-62888). In FIGS. 6A and 6B, the mask is of a membrane type which is constructed by an about 150 nm thick membrane layer 601 made of silicon nitride and an about 30 nm thick electron shield layer 602 made of tungsten/chromium. In the electron shield layer 602, openings 602a and 602b each having a terminated pattern and an opening 603c having an endless pattern are perforated. The membrane layer 601 is supported by a supporting plate 603 made of silicon, which is also supported by a ring-shaped reinforced member 604.

In the mask of FIGS. 6A and 6B, since an island 602d of the electron shield layer 602 is supported by the membrane layer 601, the island 602d is never separated from the rest of the electron shield layer 602.

In the mask of FIGS. 6A and 6B, however, since the contrast of electron beams through the electron shield layer 602 is deteriorated by the presence of the membrane layer 601. Also, since electron beams through the electron shield layer 602 are scattered by the membrane layer 601, the blurring of the electron beams is increased. Thus, the membrane type mask of FIGS. 6A and 6B cannot provide a higher resolution for terminated patterns as compared with the stencil type mask of FIGS. 2A and 2B.

Figure 7:
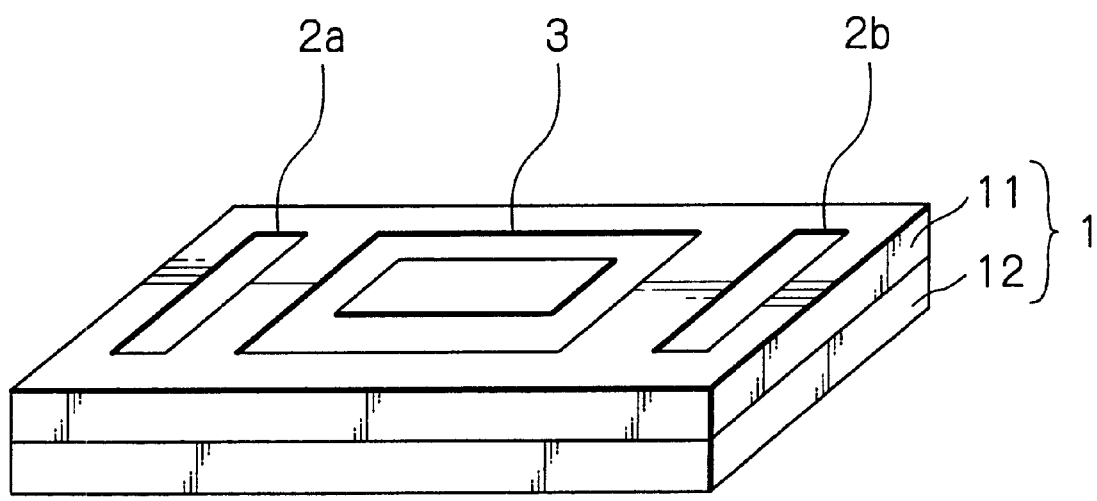
FIG. 7 is a perspective view illustrating a first embodiment of the mask according to the present invention.
Figure 8A:
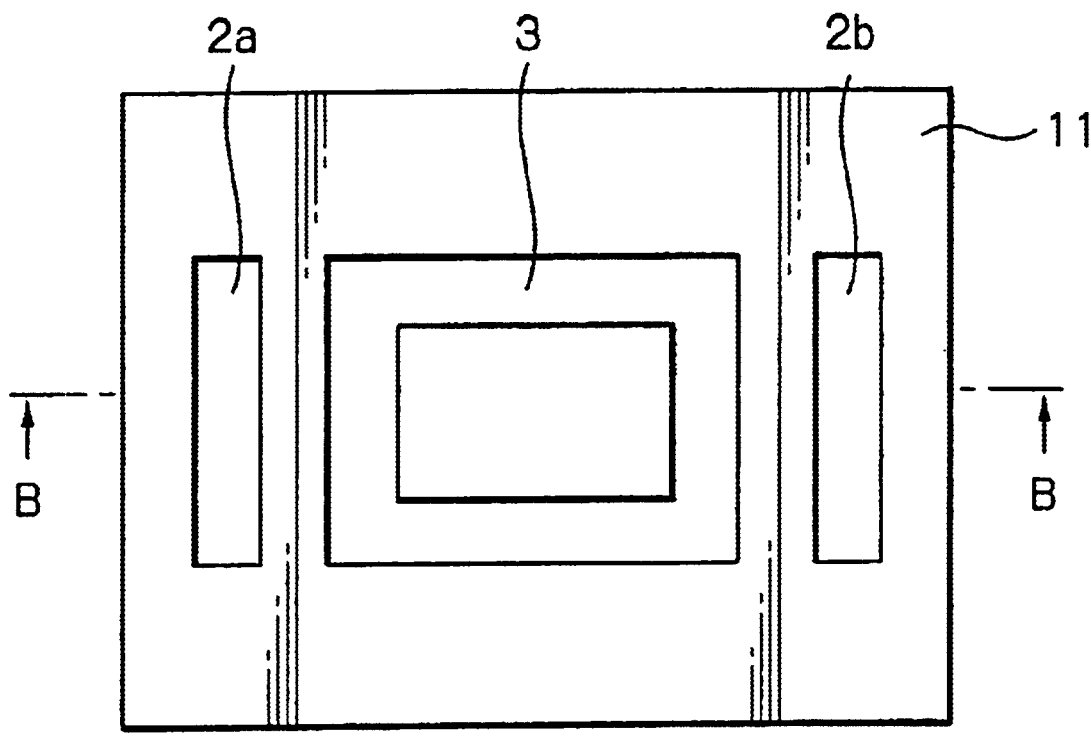
FIG. 8A is a plan view of the mask of FIG. 7.
Figure 8B:
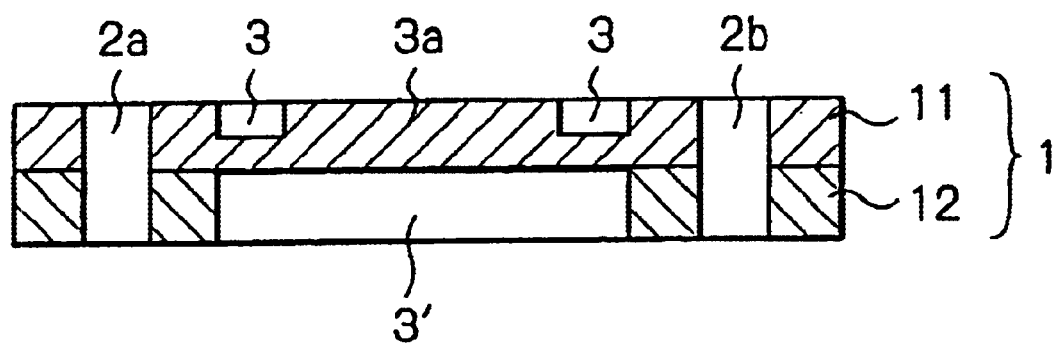
FIG. 8B is a cross-sectional view taken along the line B—B of FIG. 8A.

FIG. 7 is a perspective view illustrating a first embodiment of the mask according to the present invention, FIG. 8A is a plan view of the mask of FIG. 7, and FIG. 8B is a cross-sectional view taken along the line B—B of FIG. 8A.

In FIGS. 7, 8A and 8B, a mask 1 is constructed by an about 100 to 200 μm thick membrane structure 11 made of silicon and an about 200 to 500 μm thick stencil structure 12 made of silicon which are adhered to each other by insulating adhesives (not shown).

Openings 2a and 2b each for a terminated pattern are perforated in the membrane structure 11 and the stencil structure 12. On the other hand, a recess 3 for an endless pattern is perforated only in the membrane structure 11. In this case, the membrane structure 11 at the recess 3 is about 10 to 100 nm thick. Also, an opening 3' corresponding to the endless pattern including the island 3a thereof is perforated in the stencil structure 12.

The mask of FIGS. 7, 8A and 8B is supported by a supporting plate (not shown) which is similar to the supporting plate 603 of FIG. 6B.

In the mask of FIGS. 7, 8A and 8B, since the openings 2a and 2b for terminated patterns are perforated in the membrane structure 11 and the stencil structure 12, the contrast of electron beams through the openings 2a and 2b is not deteriorated. Also, since the electron beams through the openings 2a and 2b are not scattered by the membrane structure 11, the blurring of the electron beams is not increased. Thus, a higher resolution can be realized for the terminated patterns 901a and 901b. On the other hand, since the recess 3 for the endless pattern 902 is formed by the membrane structure 11, the island 3a is never separated therefrom. Thus, the endless pattern can be surely realized.

A method for manufacturing the mask of FIGS. 7, 8A and 8B will be explained next with reference to FIGS. 9A, 9B, 9C, 10A, 10B, 10C, 10D, 10E, 10F, 10G, 11A, 11B, 11C, 11D, 11E, 11F, 11G, 12A, 12B, 12C and 12D.

Figure 9A:
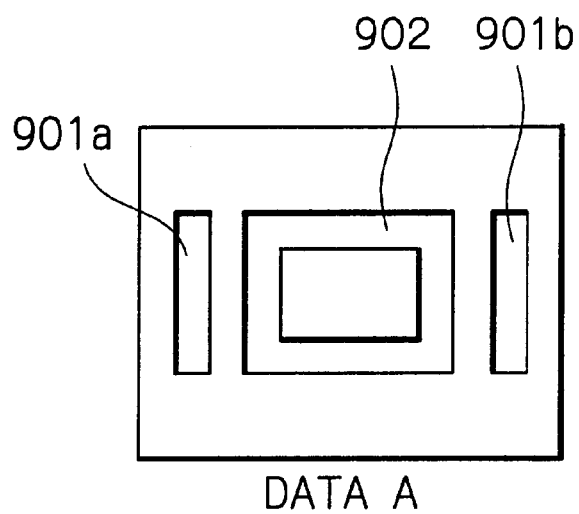
FIGS. 9A, 9B and 9C are diagrams showing design pattern data used in the manufacture of the mask of FIGS. 7, 8A and 8B.
Figure 9B:
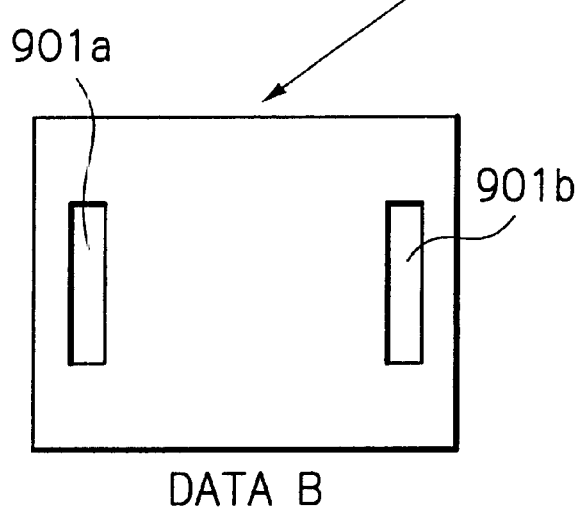
Figure 9C:
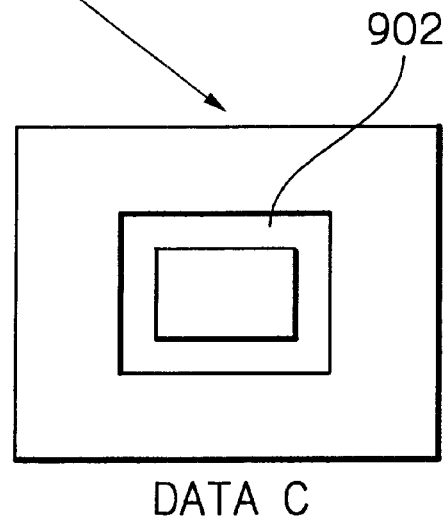

First, design pattern data A as shown in FIG. 9A including terminated pattern data 901a and 901b and an endless pattern data 902 is divided into design data B as shown in FIG. 9B including only the terminated pattern data 901a and 901b and design data C as shown in FIG. 9C including only the endless pattern data 902.

Figure 10A:

Next, referring to FIG. 10A, an about 100 to 200 μm thick monocrystalline silicon substrate 1001 is prepared.

Figure 10B:

Next, referring to FIG. 10B, a positive type photoresist layer 1002 is coated on the entire surface, and a photolithography process is performed upon the positive type photoresist layer 1002 by using the design data B of FIG. 9B.

Figure 10C:

Next, referring to FIG. 10C, a dry or wet etching process is performed upon the silicon substrate 1001 by using the positive type photoresist layer 1002 as a mask. Then, the photoresist layer 1002 is removed, so that openings 1001a and 1001b for the terminated patterns 901a and 901b are perforated in the silicon substrate 1001, as illustrated in FIG. 10D.

Figure 10E:
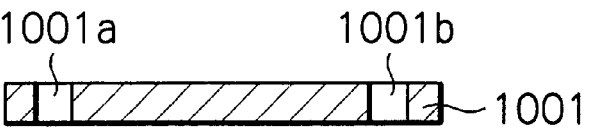

Next, referring to FIG. 10E, a positive type photoresist layer 1003 is again coated on the entire surface, and a photolithography process is performed upon the positive type photoresist layer 1003 by using the design data C of FIG. 9C.

Figure 10F:
Figure 10G:
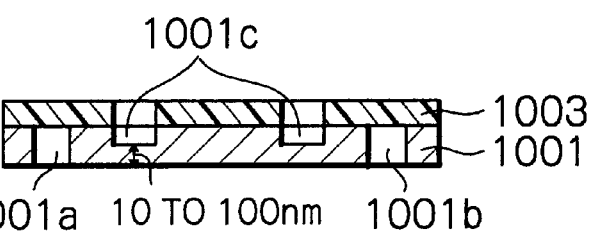

Next, referring to FIG. 10F, a dry or wet etching process is performed upon the silicon substrate 1001 by using the positive type photoresist layer 1003 as a mask. In this case, the etching of the silicon substrate 1001 is stopped, so that the silicon substrate 1001 at its etched portion is about 10 to 100 nm thick. Then, the photoresist layer 1003 is removed, so that an opening 1001c for the endless patterns 902 is perforated in the silicon substrate 1001, as illustrated in FIG. 10G.

Thus, the membrane structure 11 of FIGS. 7, 8A and 8B is completed.

Note that the steps as illustrated in FIGS. 10A, 10B, 10C, 10D, 10E, 10F and 10G can be replaced by steps as illustrated in FIGS. 11A, 11B, 11C, 11D, 11E, 11F and 11G.

Figure 11A:

That is, referring to FIG. 11A, an about 100 to 200 μm thick monocrystalline silicon substrate 1001 is prepared.

Figure 11B:
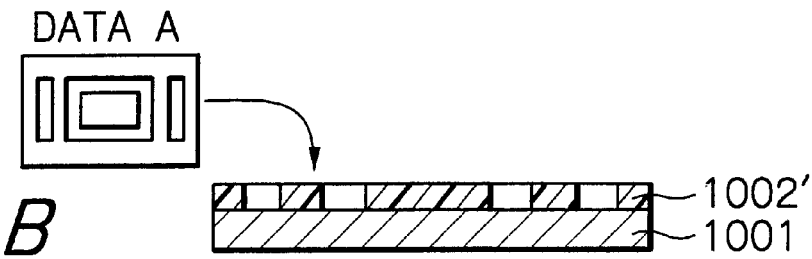

Next, referring to FIG. 11B, a positive type photoresist layer 1002' is coated on the entire surface, and a photolithography process is performed upon the positive type photoresist layer 1002' by using the design data A of FIG. 9A.

Figure 11C:
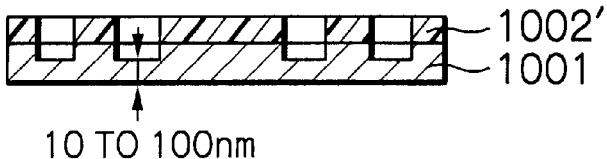
Figure 11D:
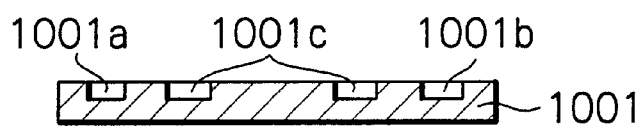

Next, referring to FIG. 11C, a dry or wet etching process is performed upon the silicon substrate 1001 by using the positive type photoresist layer 1002' as a mask. In this case, the etching of the silicon substrate 1001 is stopped, so that the silicon substrate 1001 at its etched portion is about 10 to 100 nm thick. Then, the photoresist layer 1002' is removed, so that openings 1001a and 1001b for the terminated patterns 901a and 901b and an opening 1001c for the endless pattern 902 are perforated in the silicon substrate 1001, as illustrated in FIG. 11D.

Figure 11E:
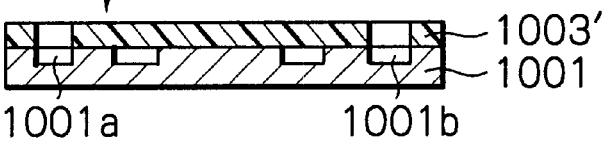

Next, referring to FIG. 11E, a positive type photoresist layer 1003' is again coated on the entire surface, and a photolithography process is performed upon the positive type photoresist layer 1003' by using the design data B of FIG. 9B.

Figure 11F:
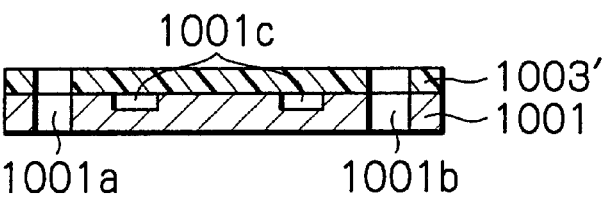
Figure 11G:
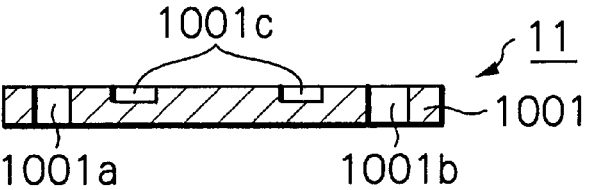

Next, referring to FIG. 11F, a dry or wet etching process is performed upon the silicon substrate 1001 by using the positive type photoresist layer 1003' as a mask. Then, the photoresist layer 1003' is removed, so that the openings 1001a and 1001b for the terminated patterns 901a and 901b are further perforated in the silicon substrate 1001, as illustrated in FIG. 11G.

Thus, the membrane structure 11 of FIGS. 7, 8A and 8B is also completed.

Figure 12A:
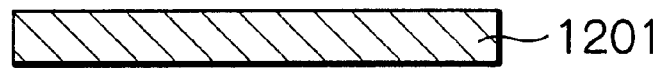

Next, referring to FIG. 12A, an about 200 to 500 μm thick monocrystalline silicon substrate 1201 is prepared.

Figure 12B:
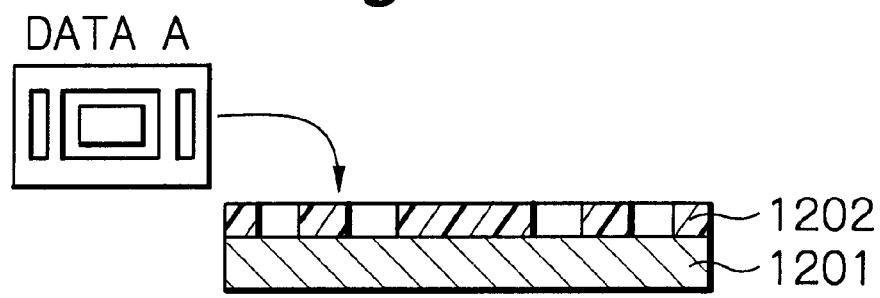

Next, referring to FIG. 12B, a positive type photoresist layer 1202 is coated on the entire surface, and a photolithography process is performed upon the positive type photoresist layer 1202 by using the design data A of FIG. 9A.

Figure 12C:
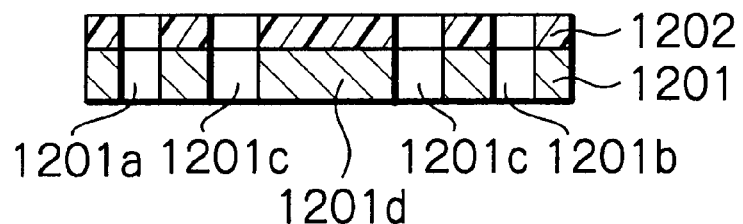
Figure 12D:
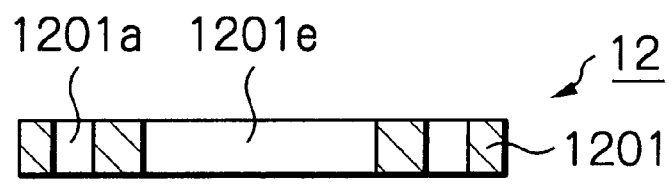

Next, referring to FIG. 12C, a dry or wet etching process is performed upon the silicon substrate 1201 by using the positive type photoresist layer 1202 as a mask. Then, the photoresist layer 1202 is removed, so that openings 1201a and 1201b for the terminated patterns 901a and 901b and an opening 1201c for the endless pattern are perforated in the silicon substrate 1201, as illustrated in FIG. 12D. In this case, an island 1201d of the silicon substrate 1201 is also separated therefrom. Therefore, an opening 1201e corresponding to the endless pattern including the island thereof is perforated in the silicon substrate 1201.

Thus, the stencil structure 12 of FIGS. 7, 8A and 8B is completed.

Finally, the membrane structure 11 of FIG. 10G (11G) is adhered by insulating adhesives (not shown) to the stencil structure 12 of FIG. 12D, thus completing the mask of FIGS. 7, 8A and 8B.

Figure 13:
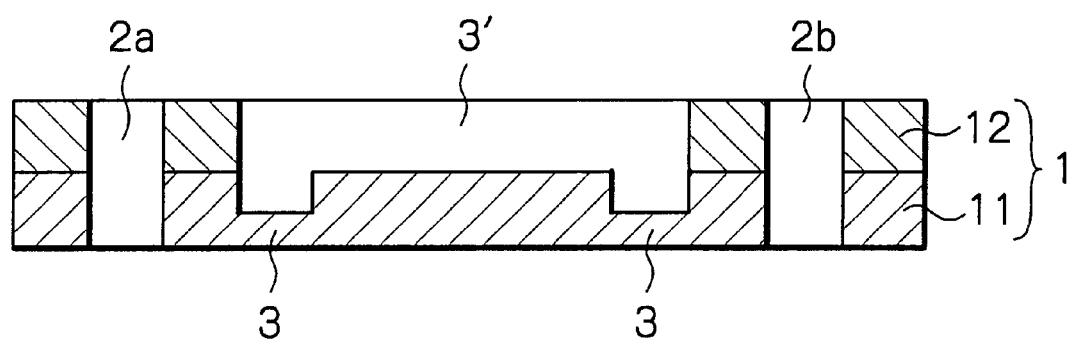
FIGS. 13 and 14 are cross-sectional views illustrating modifications of the mask of the first embodiment.

In FIG. 13, which is a cross-sectional view illustrating a modification of the mask of the first embodiment, the stencil structure 12 of FIG. 12D is located on the membrane structure 11 of FIG. 10G (11G).

Figure 14:
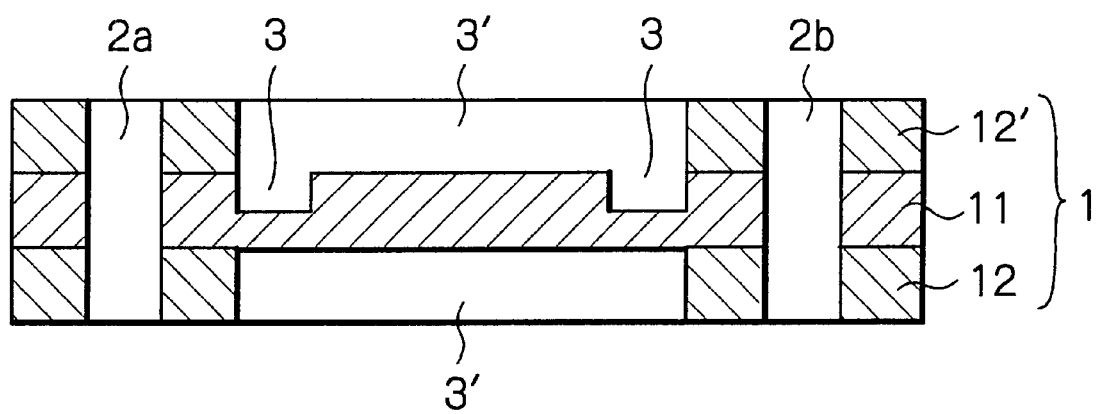

Also, in FIG. 14, which is a cross-sectional view illustrating another modification of the mask of the first embodiment, the membrane structure 11 of FIG. 10G (11G) is sandwiched by two stencil structures 12 and 12' of FIG. 12D which are the same as each other. Although the membrane structure 11 is mechanically weak, the membrane structure 11 is reinforced by the stencil structures 12 and 12' which are mechanically strong.

Figure 15A:
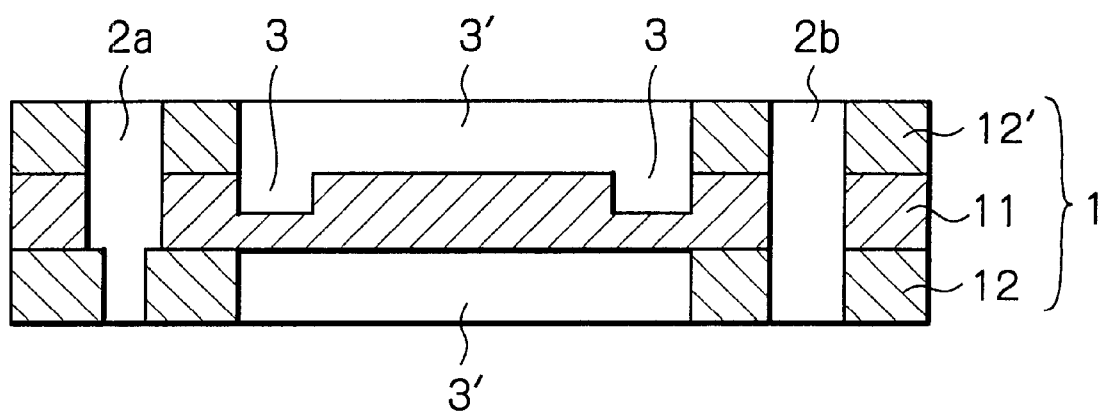
FIG. 15A is a cross-sectional view illustrating a modification of the mask of FIG. 14.
Figure 15B:
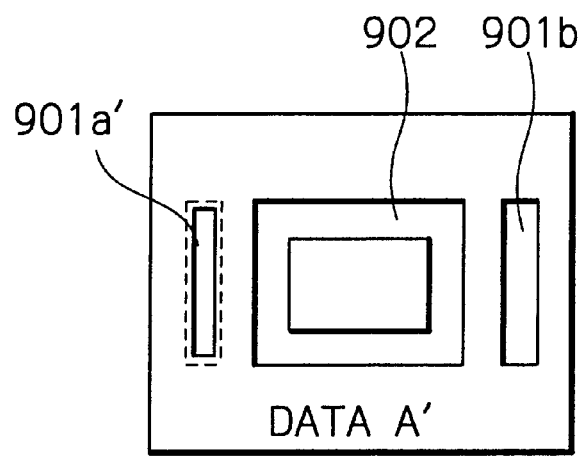
FIG. 15B is a diagram pattern data used in the manufacture of the mask of FIG. 15A.

In FIG. 15A, which is a cross-sectional view illustrating a modification of the mask of FIG. 14, at least one of the openings 2a and 2b of the stencil structure 12 is smaller than the corresponding one of FIG. 14. In this case, the stencil structure 12 is manufactured by using design data A' as shown in FIG. 15B where terminated pattern data 901a' is different from the terminated pattern data 901a. As a result, since a pattern to be depicted can be resized, it is possible to correct the proximity effect of electron beams, which is helpful in improving the electron lithography process.

Figure 16:
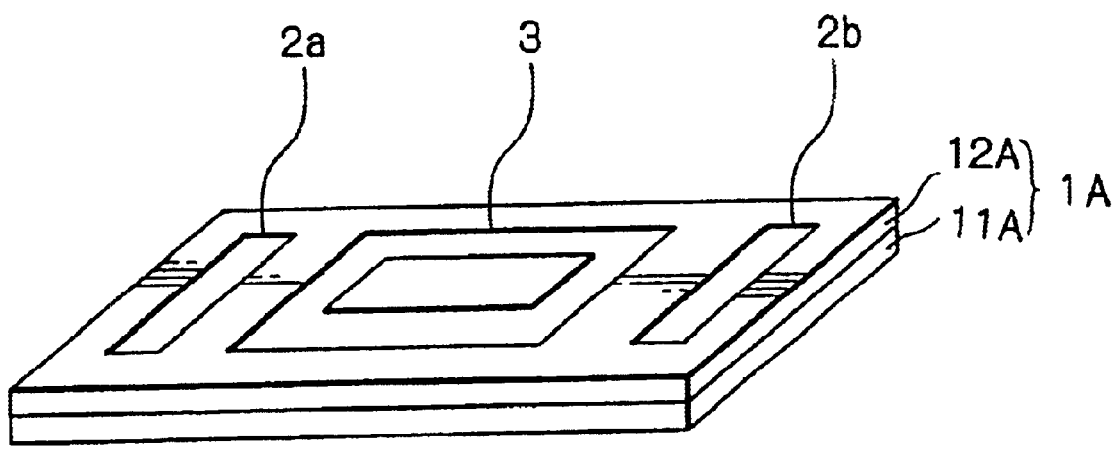
FIG. 16 is a perspective view illustrating a second embodiment of the mask according to the present invention.
Figure 17A:
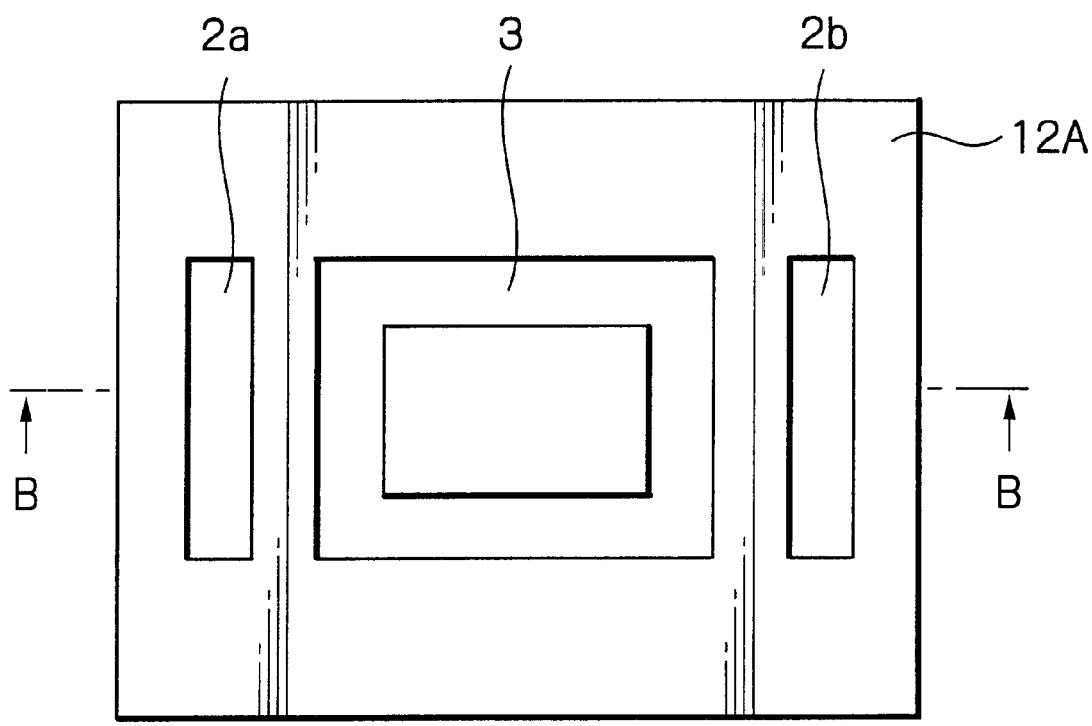
FIG. 17A is a plan view of the mask of FIG. 16.
Figure 17B:
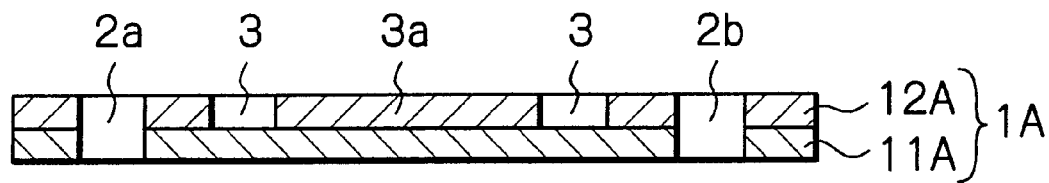
FIG. 17B is a cross-sectional view taken along the line B—B of FIG. 17A.

FIG. 16 is a perspective view illustrating a second embodiment of the mask according to the present invention, FIG. 17A is a plan view of the mask of FIG. 16, and FIG. 17B is a cross-sectional view taken along the line B—B of FIG. 17A.

In FIGS. 16, 17A and 17B, a mask 1A is constructed by an about 10 to 100 μm thick membrane structure 11A made of silicon nitride and an about 200 to 500 μm thick stencil structure 12A made of silicon which are adhered to each other by insulating adhesives (not shown).

Openings 2a and 2b each for a terminated pattern are perforated in the membrane structure 11A and the stencil structure 12A. On the other hand, a recess 3 for an endless pattern is perforated only in the stencil structure 12A. In this case, an island 3a of the stencil structure 12A for the endless pattern is supported by the membrane structure 11A, the island 3a of the stencil structure 12A for the endless pattern is never separated from the rest of the stencil structure 12A.

In the mask of the second embodiment, a silicon carbide (SiC) can be used instead of silicon nitride. Also, silicon associated with silicon nitride can be replaced by a Si—SiN—Si substrate, which improves the mechanical strength of the mask and reduces a strain generated therein.

A method for manufacturing the mask of FIGS. 16, 17A and 17B will be explained next with reference to FIGS. 9A, 9C, 18A, 18B, 18C, 18D, 18E, 18F and 18G.

Figure 18A:
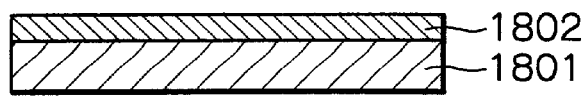
FIGS. 18A, 18B, 18C, 18D, 18E, 18F and 18G are cross-sectional views for explaining a method for manufacturing the mask of FIGS. 16, 17A and 17B.
Figure 18A:

First, referring to FIG. 18A, an about 10 to 100 nm thick silicon nitride layer 1802 is deposited on an about 200 to 500 μm thick monocrystalline silicon substrate 1801 by a chemical vapor deposition (CVD) process. Then, the silicon substrate 1801 is reversed.

Figure 18B:
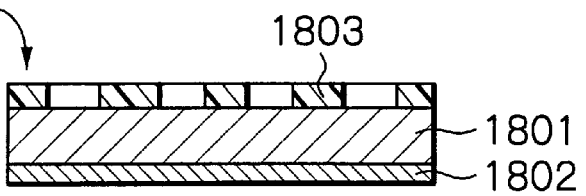

Next, referring to FIG. 18B, a positive type photoresist layer 1803 is coated on the entire surface of the silicon substrate 1801, and a photolithography process is performed upon the positive type photoresist layer 1803 by using the design data A of FIG. 9A.

Figure 18C:
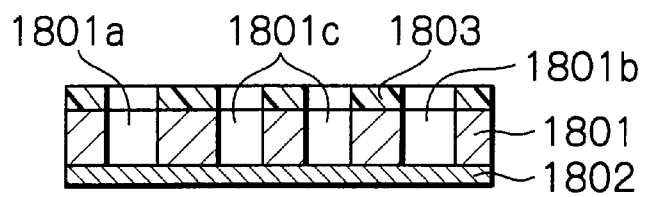
Figure 18D:
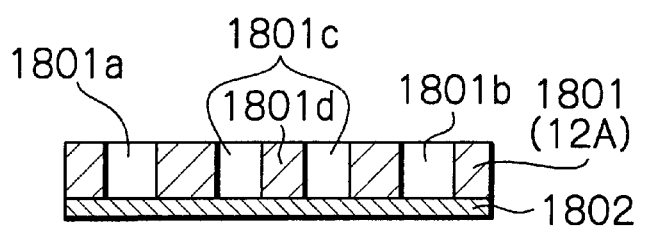
Figure 18D:
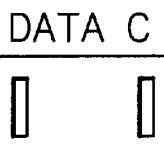

Next, referring to FIG. 18C, a dry or wet etching process is performed upon the silicon substrate 1801 by using the positive type photoresist layer 1803 as a mask and the silicon nitride layer 1802 as an etching stopper. Then, the photoresist layer 1803 is removed, so that openings 1801a and 1801b for the terminated patterns 901a and 901b and an opening 1801c for the endless patterns 902 are perforated in the silicon substrate 1801, as illustrated in FIG. 18D.

Thus, the silicon substrate 1801 serves as the stencil structure 12A of FIGS. 16, 17A and 17B; however, in this case, an island 1801d of the stencil structure 12A is never separated from the rest of the silicon substrate 1801, since the island 1801d is supported by the silicon nitride layer 1802.

Figure 18E:
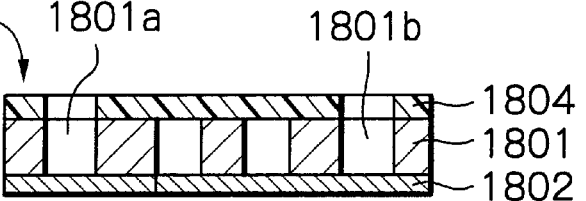

Next, referring to FIG. 18E, a positive type photoresist layer 1804 is again coated on the entire surface, and a photolithography process is performed upon the positive type photoresist layer 1804 by using the design data C of FIG. 9C.

Figure 18F:
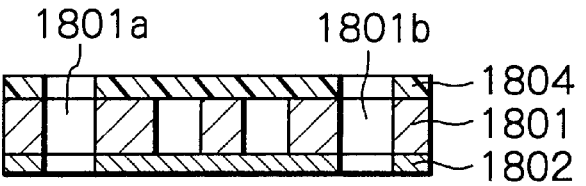
Figure 18G:
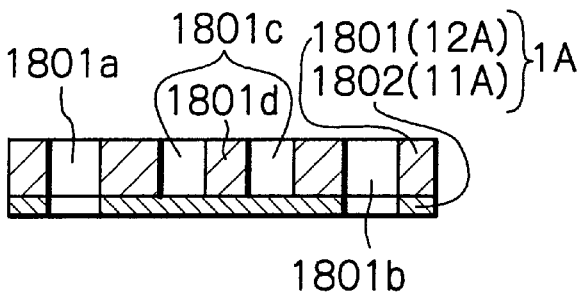

Next, referring to FIG. 18F, a dry or wet etching process is performed upon the silicon nitride layer 1802 by using the positive type photoresist layer 1804 as a mask. Then, the photoresist layer 1804 is removed, so that the openings 1801a and 1801b for the terminated patterns 901a and 902b are further perforated in the silicon nitride layer 1802, as illustrated in FIG. 18G.

Thus, the mask 1A of FIGS. 16, 17A and 17B is completed.

The mask of FIGS. 16, 17A and 17B is supported by a supporting plate (not shown) which is similar to the supporting plate 603 of FIG. 6B.

Even in the mask of FIGS. 16, 17A and 17B, since the openings 2a and 2b for terminated patterns are perforated in the membrane structure 11A and the stencil structure 12A, the contrast of electron beams through the openings 2a and 2b is not deteriorated. Also, since the electron beams through the openings 2a and 2b are not scattered by the membrane structure 11A, the blurring of the electron beams is not increased. Thus, a higher resolution can be realized for the terminated patterns 901a and 901b. On the other hand, since the recess 3 for the endless pattern 902 is formed by the membrane structure 11A, the island 3a is never separated therefrom. Thus, the endless pattern can be surely realized.

Figure 19:
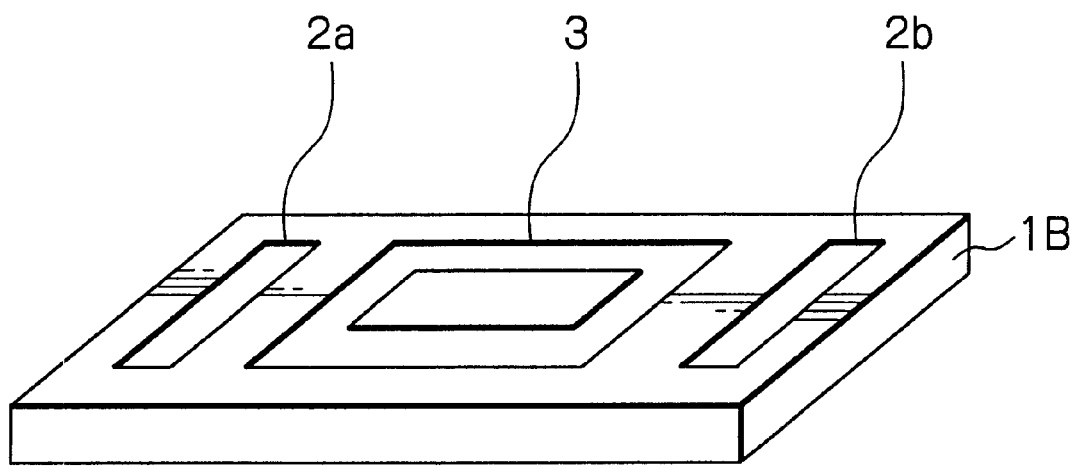
FIG. 19 is a perspective view illustrating a third embodiment of the mask according to the present invention.
Figure 20A:
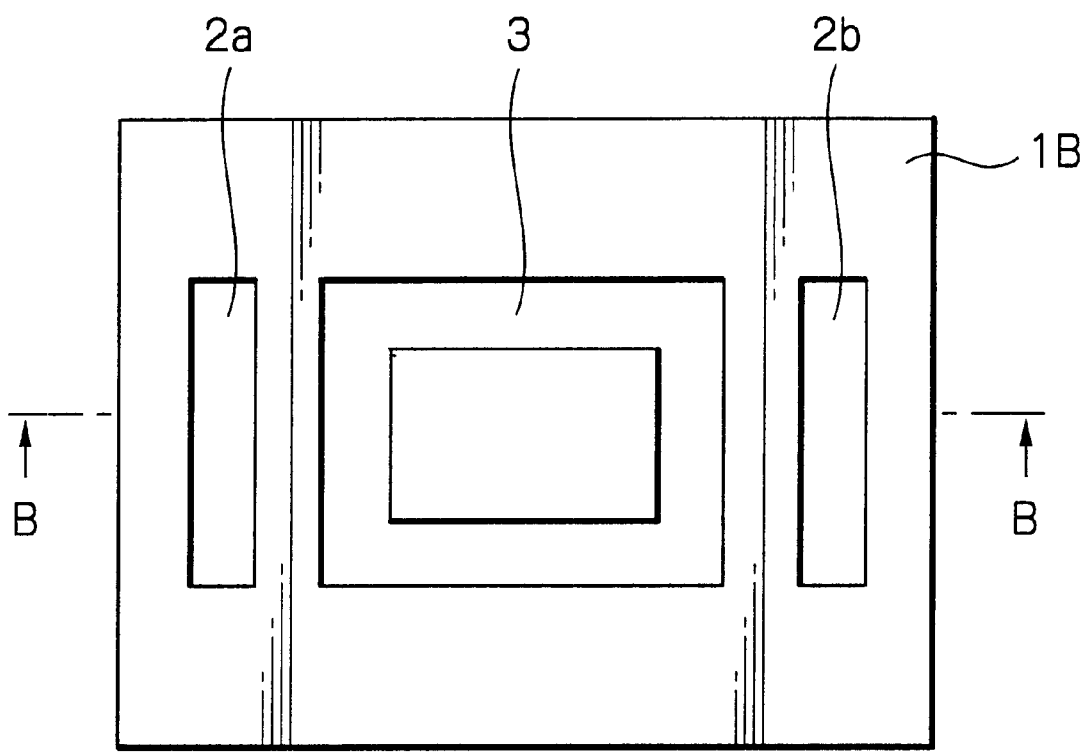
FIG. 20A is a plan view of the mask of FIG. 19.
Figure 20B:
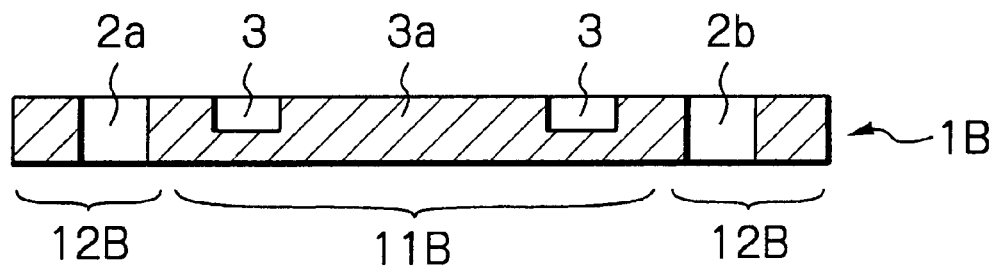
FIG. 20B is a cross-sectional view taken along the line B—B of FIG. 20A.

FIG. 19 is a perspective view illustrating a third embodiment of the mask according to the present invention, FIG. 20A is a plan view of the mask of FIG. 19, and FIG. 20B is a cross-sectional view taken along the line B—B of FIG. 20A.

In FIGS. 19, 20A and 20B, a mask 1B is constructed by an about 200 to 500 μm thick monocrystalline silicon substrate where an about 10 to 100 μm thick membrane structure 11B and an about 200 to 500 μm thick stencil structure 12B are formed.

Openings 2a and 2b each for a terminated pattern are perforated in the stencil structure 12B. On the other hand, a recess 3 for an endless pattern is perforated only in the membrane structure 11B. In this case, an island 3a of the membrane structure 11B for the endless pattern is supported by the membrane structure 11B per se, the island 3a of the membrane structure 11B for the endless pattern is never separated from the rest of the membrane structure 11B.

A method for manufacturing the mask of FIGS. 19, 20A and 20B will be explained next with reference to FIGS. 9B, 9C, 21A, 21B, 21C, 21D, 21E, 21F and 21G.

Figure 21A:
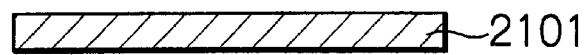
FIGS. 21A, 21B, 21C, 21D, 21E, 21F and 21G are cross-sectional views for explaining a method for manufacturing the mask of FIGS. 19, 20A and 20B.

First, referring to FIG. 21A, an about 200 to 500 μm thick monocrystalline silicon substrate 2101 is prepared.

Figure 21B:

Next, referring to FIG. 21B, a positive type photoresist layer 2102 is coated on the entire surface of the silicon substrate 2101, and a photolithography process is performed upon the positive type photoresist layer 2102 by using the design data B of FIG. 9B.

Figure 21C:
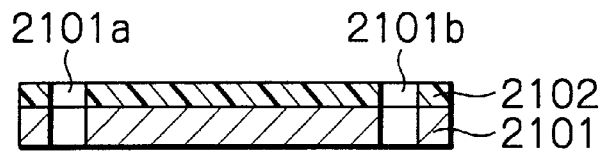
Figure 21D:
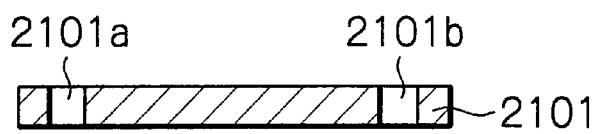

Next, referring to FIG. 21C, a dry or wet etching process is performed upon the silicon substrate 2101 by using the positive type photoresist layer 2102 as a mask. Then, the photoresist layer 2101 is removed, so that openings 2101a and 2101b for the terminated patterns 901a and 901b are perforated in the silicon substrate 2101, as illustrated in FIG. 21D.

Figure 21E:
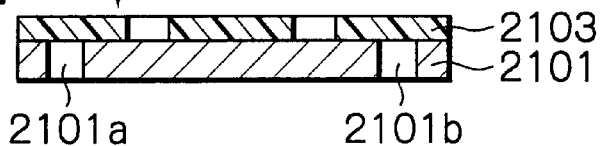

Next, referring to FIG. 21E, a positive type photoresist layer 2103 is again coated on the entire surface, and a photolithography process is performed upon the positive type photoresist layer 2103 by using the design data C of FIG. 9C.

Figure 21F:
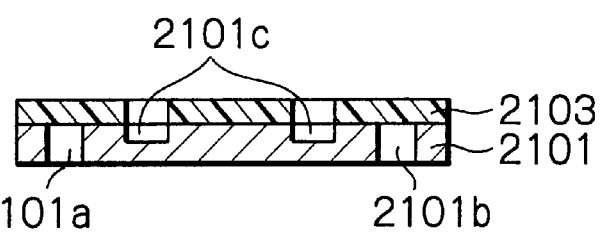
Figure 21G:
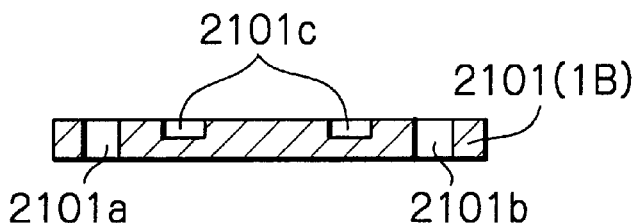

Next, referring to FIG. 21F, a dry or wet etching process is performed upon the silicon substrate 2101 by using the positive type photoresist layer 2103 as a mask. In this case, the etching of the silicon substrate 2101 is stopped, so that the silicon substrate 2101 at its etched portion is about 10 to 100 nm thick. Then, the photoresist layer 2103 is removed, so that an opening 2101c for an endless pattern 902 is perforated in the silicon substrate 2101, as illustrated in FIG. 21G.

Thus, the mask 1B of FIGS. 19, 20A and 20B is completed.

The mask of FIGS. 19, 20A and 20B is supported by a supporting plate (not shown) which is similar to the supporting plate 603 of FIG. 6B.

Even in the mask of FIGS. 19, 20A and 20B, since the openings 2a and 2b for terminated patterns are perforated in the stencil structure 12B, the contrast of electron beams through the openings 2a and 2b is not deteriorated. Also, since the electron beams through the openings 2a and 2b are not scattered by the membrane structure 11B, the blurring of the electron beams is not increased. Thus, a higher resolution can be realized for the terminated patterns 901a and 901b. On the other hand, since the recess 3 for the endless pattern 902 is formed by the membrane structure 11B, the island 3a is never separated therefrom. Thus, the endless pattern can be surely realized.

In the above-described embodiments, although an endless pattern forms a perforated rectangle, the present invention can be applied to other types endless patterns. Also, negative photoresist layers can be used instead of the positive photoresist patterns. Further, in the present invention, three or more terminated patterns and two or more endless patters can be provided in one mask. Still further, the present invention can be applied to other masks such as a changed particle exposure, a neutron exposure and an X-ray exposure.

As explained hereinabove, according to the present invention, since openings for terminated patterns are completely perforated in a mask, the contrast of electron beams or the like therethrough is not deteriorated. Also, since such electron beams or the like are not scattered by a membrane structure, the blurring of the electron beams or the like is not increased. As a result, a higher resolution can be realized for the terminated patterns. On the other hand, endless patterns can be surely formed by the membrane structure.

What is claimed is:

1. A mask for beam exposure comprising a membrane structure for endless patterns and a stencil structure for terminated patterns in combination.

2. The mask as set forth in claim 1, wherein said membrane structure and said stencil structure are adhered to each other,
    wherein first openings for said terminated patterns and recesses for said endless patterns are formed in said membrane structure, and second openings for said terminated patterns and third openings for said endless patterns including islands thereof are formed in said stencil structure.

3. The mask as set forth in claim 2, wherein each of said membrane structure and said stencil structure comprises a silicon substrate.

4. The mask as set forth in claim 2, wherein at least one of said second openings is smaller than a designed opening.

5. The mask as set forth in claim 1, wherein said membrane structure and said stencil structure are adhered to each other,
    wherein first openings for said terminated patterns are formed in said membrane structure, second openings for said endless patterns and third openings for said terminated patterns are formed in said stencil structure.

6. The mask as set forth in claim 5, wherein said membrane structure comprises a silicon nitride layer, and said stencil structure comprises a silicon substrate.

7. The mask as set forth in claim 5, wherein said membrane structure comprises a silicon carbide layer, and said stencil structure comprises a silicon substrate.

8. The mask as set forth in claim 5, wherein said membrane structure and said stencil structure comprise a Si—SiN—Si substrate.

9. The mask as set forth in claim 5, wherein at least one of said second openings is smaller than a designed opening.

10. The mask as set forth in claim 1, wherein said membrane structure and said stencil structure comprise one substrate, wherein openings for said terminated patterns are formed in said substrate, and recesses for said endless patterns are formed in said substrate.

11. The mask as set forth in claim 10, wherein said substrate comprises a silicon substrate.

12. A mask for beam exposure comprising a membrane structure for endless patterns and two stencil structures for terminated patterns, said membrane structure being sandwiched by said stencil structures, wherein first openings for said terminated patterns and recesses for said endless patterns are formed in said membrane structure, and second openings for said terminated patterns and third openings for said endless patterns including islands thereof are formed in said stencil structures.

13. The mask as set forth in claim 12, wherein each of said membrane structure and said stencil structures comprises a silicon substrate.

14. The mask as set forth in claim 12, wherein at least one of said second openings is smaller than a designed opening.

15. A method for manufacturing a mask for beam exposure, comprising the steps of:

extracting terminated pattern data and endless pattern data from design pattern data;

performing a first photolithography and etching process using said terminated pattern data upon a first substrate to form first openings in said first substrate;

performing a second photolithography and etching process using said endless pattern data upon said first substrate to form recesses in said first substrate;

performing a third photolithography and etching process using said design pattern data upon a second substrate to from second openings in said second substrate; and adhering said first substrate to said second substrate so that said first openings correspond to respective ones of said second openings.

16. A method for manufacturing a mask for beam exposure, comprising the steps of:

extracting terminated pattern data and endless pattern data from design pattern data;

performing a first photolithography and etching process using said design pattern data upon a first substrate to form recesses in said first substrate;

performing a second photolithography and etching process using said terminated pattern data upon said first substrate to form first openings in said first substrate;

performing a third photolithography and etching process using said design pattern data upon a second substrate to from second openings in said second substrate; and adhering said first substrate to said second substrate so that said first openings correspond to respective ones of said second openings.

17. A method for manufacturing a mask for beam exposure, comprising the steps of:

extracting terminated pattern data and endless pattern data from design pattern data;

forming a layer on a substrate;

performing a first photolithography and etching process using said design pattern data upon said substrate and said layer as an etching stopper to form openings in said substrate; and performing a second photolithography and etching process using said terminated pattern data upon said substrate to form openings in said layer.

18. A method for manufacturing a mask for beam exposure, comprising the steps of:

extracting terminated pattern data and endless pattern data from design pattern data;

performing a first photolithography and etching process using said terminated pattern data upon a substrate to form openings in said substrate; and performing a second photolithography and etching process using said endless pattern data upon said substrate to form recesses in said substrate.

* * * * *